US010345340B2

(12) United States Patent
Gravermann et al.

(10) Patent No.: US 10,345,340 B2
(45) Date of Patent: Jul. 9, 2019

(54) VOLTAGE SENSING DEVICE

(71) Applicant: 3M INNOVATIVE PROPERTIES COMPANY, St. Paul, MN (US)

(72) Inventors: Mark Gravermann, Erkelenz (DE); Friedrich A. Busemann, Amelinghausen (DE); Bernd Schubert, Cologne (DE); Gerhard Lohmeier, Cologne (DE); Andreea Sabo, Dusseldorf (DE); Rainer Reeken, Dormagen (DE); Michael H. Stalder, Uedem (DE); Christian Weinmann, Alsdorf (DE); Sebastian Eggert, Dusseldorf (DE); Dipankar Ghosh, Oakdale, MN (US); Myungchan Kang, Woodbury, MN (US); Christopher D. Sebesta, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 15/106,648

(22) PCT Filed: Dec. 16, 2014

(86) PCT No.: PCT/US2014/070540
§ 371 (c)(1),
(2) Date: Jun. 20, 2016

(87) PCT Pub. No.: WO2015/095158
PCT Pub. Date: Jun. 25, 2015

(65) Prior Publication Data
US 2016/0341768 A1    Nov. 24, 2016

(30) Foreign Application Priority Data

Dec. 18, 2013   (EP) .................................... 13198142

(51) Int. Cl.
*G01R 15/16* (2006.01)
*G01R 19/00* (2006.01)

(52) U.S. Cl.
CPC ......... *G01R 15/16* (2013.01); *G01R 19/0084* (2013.01)

(58) Field of Classification Search
None
See application file for complete search history.

(56) References Cited

U.S. PATENT DOCUMENTS 4,500,748 A  *   2/1985  Klein ....................... C08K 3/00
                                                 174/121 A
5,363,046 A  *  11/1994  Shimasaki ............... F02P 13/00
                                                   324/126

(Continued)

FOREIGN PATENT DOCUMENTS

CN          1534300 A      10/2004
CN        101897241 A      11/2010

(Continued)

OTHER PUBLICATIONS

International Search report for PCT International Application No. PCT/US2014/070540 dated Mar. 3, 2015, 3pages.

(Continued)

*Primary Examiner* — Paresh H Patel
(74) *Attorney, Agent, or Firm* — Gregg H. Rosenblatt (57) ABSTRACT

The invention relates to a voltage sensing device for a high and/or medium-voltage power-carrying conductor, the voltages sensing device comprising: • a carrier element (3) with a passageway for receiving the power-carrying conductor, • wherein the carrier element comprises an electrode (4) extending in an axial direction of the passageway of the carrier element and operable as a first electrode of the voltage sensing device, wherein • a conductor (1) of the power cable is operable as the second electrode of the (Continued)

voltage sensing device and wherein • the carrier element has a coefficient of thermal expansion that is less than $5\times10^{-6}$ 1/K at 20 C.

15 Claims, 3 Drawing Sheets

(56) References Cited

U.S. PATENT DOCUMENTS

| | | | |
|---|---|---|---|
| 6,313,635 | B1 | 11/2001 | Noll |
| 6,489,782 | B1 | 12/2002 | Baier |
| 6,850,399 | B1 * | 2/2005 | Kato ............... G01R 15/142 |
| | | | 361/132 |
| 9,685,502 | B2 * | 6/2017 | Wood ............... H01L 29/1004 |
| 2001/0048308 | A1 | 12/2001 | Potter |
| 2006/0202671 | A1 | 9/2006 | Mulligan |
| 2009/0189617 | A1 * | 7/2009 | Burns ............... E21B 43/24 |
| | | | 324/649 |
| 2010/0156441 | A1 | 6/2010 | Moliton |
| 2010/0273048 | A1 * | 10/2010 | Machida ............ H01M 10/056 |
| | | | 429/188 |
| 2014/0354302 | A1 * | 12/2014 | Lu ............... G01R 19/0084 |
| | | | 324/658 |

FOREIGN PATENT DOCUMENTS

| | | |
|---|---|---|
| CN | 102543427 | 7/2012 |
| CN | 103261845 A | 8/2013 |
| EP | 2608338 | 6/2013 |
| GB | 1058890 | 2/1967 |
| KR | 2000252652 | 11/2001 |
| WO | WO 2001-094956 | 12/2001 |
| WO | WO 2009/052041 A1 | 4/2009 |
| WO | WO 2012/052584 A1 | 4/2012 |
| WO | WO 2012-052584 | 6/2012 |
| WO | WO 2013-096354 | 6/2013 |
| WO | WO 2014-205170 | 12/2014 |
| WO | WO 2015-095150 | 6/2015 |

OTHER PUBLICATIONS

Chinese Search Report for Application No. 201480069377.0, dated Feb. 2, 2018, 2pgs.

* cited by examiner

VOLTAGE SENSING DEVICE

The invention relates to a voltage sensing device for a high- or medium-voltage power-carrying conductor for a power network. The invention also relates to the combination of such a voltage sensing device and a power-carrying conductor. Finally the invention relates to the use of such a voltage sensing device in a cable accessory, a cable splice body and/or a cable termination device.

Operators of electrical power networks monitor the state of their networks using sensors for voltage and/or current on their installations and on individual cables. An example of a voltage sensor for high- and medium-voltage power cables is described in the British patent document GB 1 058 890, in which the insulated conductor of the cable and a field-sensing probe electrode are surrounded by a guard electrode, and in which the guard and probe electrodes are connected to the input terminals of a high-gain amplifier.

EP 2 608 338 A1 discloses a terminal connection device for connecting an end of a high- or medium-voltage power cable to a connection point. According to one embodiment the terminal connection comprises a voltage sensor which is a capacitive divider in which a first capacitor consists of the cable inner conductor, the cable insulation layer and a semiconductive portion on the cable insulation layer.

CN 102543427 A discloses a capacitive voltage sensing device comprising a tubular shaped ceramic body with two electrodes.

In view of the above named prior art it would be desirable to provide a voltage sensing device for high- or medium-voltage power-carrying conductors that provides high accuracy measurements. It would also be desirable to provide a voltage sensing device for high- or medium-voltage power-carrying conductors that almost does not or does not influence the electrical field of the power cable. Further, it would be desirable to provide a voltage sensing device for high- or medium-voltage power-carrying conductors that can easily and cost-effectively be integrated into an installation or assembly of a high- or medium-voltage power-carrying conductor.

The voltage sensing device for a high- or medium-voltage power-carrying conductor according to the present invention provides a carrier element with a passageway for receiving the power-carrying conductor, wherein
the carrier element comprises an electrode extending in an axial direction of the passageway of the carrier element and operable as a first electrode of the voltage sensing device, wherein
the conductor is operable as the second electrode of the voltage sensing device and wherein
the carrier element has a coefficient of thermal expansion that is less or equal than $5 \times 10^{-6}$ 1/K at 20° C.

The invention provides a voltage sensing device with a carrier element with a very small coefficient of thermal expansion which is less than $5 \times 10^{-6}$ 1/K at 20° C., wherein the carrier element is arranged at least partially around a power-carrying conductor and comprises a first electrode of a voltage sensing device. The conductor of the power cable is operable as the second electrode of the voltage sensing device. First and second electrode may—together with a dielectric element—provide a first sensing capacitor of a voltage sensing device, for example a capacitive voltage divider or any other suitable capacitive voltage sensing device. Due to the low coefficient of thermal expansion of the carrier element the geometry of the carrier element is more or less independent of the temperature. Therefore the distance between the electrode comprised by the carrier element and the power-carrying conductor that is operable as the second electrode only depends on the thermal expansion of the cable and therefore does not change or only change in dimensions that do not effect the accuracy of the measurement. This provides the advantage of being able to provide high accuracy voltage measurements. The power-carrying conductor of the invention may be an inner conductor of a power cable, a cable connector or a bus bar. Furthermore due to the selection of materials, the voltage sensing device according to the invention provides a very compact solution that can easily be integrated into cable assemblies such as for example cable accessories, cable splice bodies and/or cable termination bodies.

According to the invention the coefficient of thermal expansion is less or equal than $5 \times 10^{-6}$ 1/K at 20° C. It may for example be $3.6 \times 10^{-6}$ 1/K at 20° C. or $2.5 \times 10^{-6}$ 1/K at 20° C.

Generally, an impact of temperature changes on the capacitance of the sensing capacitor can also be reduced by selecting materials for the carrier element which have a specific capacitance that varies little when temperature changes, i.e. materials which have a low temperature coefficient of capacitance.

In an aspect of the invention, the carrier element may comprise one or more material(s) selected from porcelain, mica, silicon nitride. In another aspect the carrier element may comprise "IEC/EN 60384 class 1" dielectrics such as $MgNb_2O_6$, $ZnNb_2O_6$, $MgTa_2O_6$, $ZnTa_2O_6$, $(Zn, Mg)TiO_3$, $(ZrSn)TiO_4$, $CaZrO_3$, or $Ba_2Ti_9O_{20}$. IEC/EN 60384 class 1 refers to the classification of the International Electrotechnical Commission IEC, in IEC/EN 60384-1 and IEC/EN 60384-8/9/21/22. In particular, the material(s) may be selected from COG (NP0) ceramics.

In an aspect of the invention, the carrier element may comprise one or more material(s) selected from polymers having a temperature coefficient of capacitance below $20 \times 10^{-6}$ 1/K in the temperature range between +10° C. and +130° C., such as Polypropylene, Polyethylene Terepthalathe, Polyester, Polyimide, Polytetrafluoroethylene, Ethylene Chlorotrifluoroethylene, Polyoxymethylene, Polyphenyl Ethers, Polyethylenimine, Polymethylpentene, Cyclic Olefin Copolymer, Polysulfone, Polyetheretherketone, Polyphenylene Sulphide, or Polyethylene Naphthalate. In other aspects of the invention, the carrier element may comprise Polyphenylene Sulphide. In further embodiments, the carrier element may comprise Polyethylene Naphthalate. Certain ones of these polymers, apart from their low temperature coefficients of capacitance, may offer high stability and reliability, high electric breakdown strength, self-healing properties and/or low dielectric loss.

In a further aspect of the invention, the carrier element may comprise a ceramic filler/polymer matrix composite. In other words, the carrier element may comprise a host polymer matrix which be filled with ceramic fillers. Such ceramic fillers may be, for example, porcelain, mica, $Si_3N_4$, COG/NP0 formulations based on $(Mg,Zn)TiO_3$, $Ba_2Ti_9O_{20}$, or $CaZrO_3$, or mixtures of these. The host polymer matrix may comprise a polymer, having a negative temperature coefficient of capacitance and the ceramic filler may comprise a material having a positive temperature coefficient of capacitance. Alternatively, the host polymer matrix may comprise a polymer, such as EPR, having a positive temperature coefficient of capacitance and the ceramic filler may comprise a material having a negative temperature coefficient of capacitance. The overall ceramic filler/polymer matrix composite may thereby have a very low temperature coefficient of capacitance. A voltage sensing device having a carrier element comprising such a composite may sense the voltage of a power-carrying conductor at a higher accuracy than other devices.

Generally, and independent of what is described above, the carrier element may comprise a first ceramic material having a positive temperature coefficient of capacitance and a second ceramic material having a negative temperature coefficient of capacitance. The carrier element may comprise a first ceramic material having a positive temperature coefficient of capacitance and a second ceramic material having a negative temperature coefficient of capacitance at one specific temperature in the temperature range between 10° C. and 130° C. A voltage sensing device having such a carrier element may sense the voltage of a power-carrying conductor at a higher accuracy than other devices.

The first electrode may comprise an electrically conductive metal, such as copper, silver, gold, nickel, aluminum, or an alloy comprising any of these materials. The inner electrode may comprise an electrically conductive polymer. Independent of other features, the radial thickness of the inner electrode may be between 1 micrometer and 1 millimeter. The inner electrode may comprise a non-ferromagnetic material, such as to transmit a magnetic field generated by the power-carrying conductor. It may, for example, comprise nickel-phosphor or an alloy comprising nickel-phosphor.

According to one embodiment of the invention, the carrier element according to the invention is shaped such that it surrounds the power-carrying conductor at least partially. Usually conductors of high- and medium-voltage power cables have a circular cross section. For a sensing capacitor with a conductor of a power cable acting as one electrode a preferred shape for the second electrode is a shape that at least partially surrounds the power cable. A preferred shape may therefore be a completely closed ring element or a ring element that provides an opening.

The carrier element may be tubular shaped and may provide a first and a second major surface as well as an axial passageway for receiving the power-carrying conductor. The tubular shaped carrier element may be completely closed along its axial extension. In such a situation the conductor may be brought into the passageway of the carrier by putting the carrier element over an end of the power-carrying conductor. It is also possible that the carrier element provides an opening along its longitudinal extension, which may provide an entry for the power-carrying conductor. The carrier element may also be made out of more than one piece, wherein the pieces may be connected with each other in an appropriate way for example over an appropriate hinge construction which would enable an easy way of opening and closing of the carrier element and therewith an easy way of putting the sensing capacitor around the power-carrying conductor. Another option would be a solution where the parts of the carrier element may be connected with each other by a plug solution. The carrier element may for example be made out of two half shells.

The carrier element according to the invention may comprise a dielectric material. Depending on the arrangement of the electrode on the carrier element, the carrier element may besides carrying the electrode also function as the dielectric element of the sensing capacitor of a voltage sensing device according to the invention.

The carrier element according to the invention may comprise a ceramic material. Ceramic materials have a low coefficient of thermal expansion. Ceramic materials further comprise a high dielectric strength and high hardness. Furthermore there are ceramic materials available on the market that provide a low rate of water absorption as well as a dielectric constant with a low temperature dependency. Chemical stability is a further property of ceramic materials that is beneficial for the application according to the invention. The low coefficient of thermal expansion provides a geometric stability over temperature ranges, which allows high accuracy measurements. The high dielectric strength is an important feature in high- and medium-voltage applications to guarantee reliability. The high hardness of the ceramic materials allows a person to dimension the carrier element such that it may be easily placed inside of cable accessories, e.g. inside a cable termination, inside a separable connector or inside a cable splice. Ceramic materials therefore fulfil several beneficial requirements of the carrier element according to the invention.

The first electrode of the voltage sensing device according to the invention may be arranged on the radially outer, first major surface of the carrier element. In such a configuration the carrier element may—amongst other components—function as a dielectric element of the sensing capacitor of a voltage sensing device. Such an embodiment of the invention may provide the advantage that the first electrode is easily accessible from the outside of the carrier element, which may allow easy installation of further electronic components to the electrode. It may also allow placing electronic components such as for example a printed circuit board on top of the first electrode for example by using soldering or other bonding technologies. The carrier element with its low coefficient of thermal expansion ensures a stable geometry of the first electrode and therewith a stable or constant distance between the first electrode and the power-carrying conductor operating as the second electrode. The described configuration is therefore especially good in providing accurate measurements. The first electrode may cover the first major surface at least partially or it may cover the first major surface completely.

The first electrode of the voltage sensing device according to the invention may also be arranged on the radially inner, second major surface of the carrier element. In such an embodiment an additional component operating as a dielectric element of a sensing device and positioned between the first and the second electrode is required. Placing the first electrode on the inner surface of the carrier element may provide the advantage that the electrode is protected by the carrier element. The carrier element with its low coefficient of thermal expansion still ensures a stable geometry of the first electrode. This is independent of the thermal coefficient of the additional component operating as a dielectric element. Therefore the distance between the first electrode and the power-carrying conductor acting as the second electrode is again stable or constant, which again ensures accurate measurements. Another advantage of this embodiment might be that the ceramic carrier is not part of the dielectric element of the voltage sensing device. Therefore it is not required that the ceramic element comprises a low rate of water absorption as well as a dielectric constant with a low temperature dependency. Therefore it might be possible to use ceramic materials that are less expensive. The first electrode may cover the second major surface at least partially or it may cover the second major surface completely.

The first electrode according to the invention may have a curved profile, in an axial longitudinal sectional view of the voltage sensing device, such that a central portion of the first electrode is radially closer to a central axis of the passageway than the first electrodes edge is. A curved profile may be advantageous in order to reduce the risk of electrical breakdown between an inner electrode and an outer electrode. A curved profile of the first electrode, as taken in an axial longitudinal section of the sensor, may operate as a geometrical stress control. The curved shape may reduce field concentration at an edge of the outer electrode. Thereby, the risk of breakdown between the electrodes through the dielectric is reduced. Applying this measure of curving the outer electrode profile may allow to reduce the spacing between the electrodes. This in turn may save space and may allow the sensor to be smaller in size.

In one specific embodiment, the curved profile may have a straight section and one or two or more curved sections, adjacent to the straight section. A curved section may be curved in a direction facing away from the central passageway.

Alternatively, the first electrode may have a straight profile, in an axial longitudinal sectional view of the voltage sensing device, such that all portions of the first electrode are radially equally close to a central axis of the passageway. A straight profile may be advantageous for keeping the overall size of the voltage sensing device small, and it may be particularly cost-effective to manufacture.

Generally, a voltage sensing device according to the present invention may be comprised in a capacitive voltage sensor assembly. The first electrode, the second electrode and a first portion of the carrier element are operable as a sensing capacitor. The sensing capacitor may therefore be comprised in the voltage sensor assembly. The voltage sensor assembly may further comprise a secondary capacitor. The sensing capacitor and the secondary capacitor may be connected in series such as to form a capacitive voltage divider. The capacitive voltage divider may be operable to sense a voltage of the power-carrying conductor, such as an inner conductor of the power cable or a cable connector or a bus bar.

The power-carrying conductor may be a cable connector, such as a cable connector for a medium-voltage or high-voltage power cable. A cable connector may be adapted to receive an inner conductor of a power cable. A cable connector may be adapted for mating, e.g. releasably or permanently, with the cable, i.e. with the inner conductor of the cable, or it may be adapted for mating with a cable adapter. The cable adapter may then be adapted for mating with the cable, i.e. with the inner conductor of the cable. The cable connector may be electrically conductive. It may comprise a conductive surface or a conductive surface portion. A cable connector may have a cylindrical shape. Generally, a shape or a profile of the cable connector may be adapted such that at least a portion of the cable connector can be received in the passageway. In a combination of a voltage sensing device according to the present invention with a cable connector, the shape or profile of the cable connector and the shape and profile of the passageway may be adapted such as to limit a movement of the voltage sensing device relative to the cable connector in one or more directions, when the cable connector is received in the passageway.

The power-carrying conductor may be a bus bar. A bus bar may have a rectangular cross section. The axial passageway of the voltage sensing device may have a rectangular cross section.

According to yet another embodiment of the invention, the first electrode of the voltage sensing device may cover the entire surface of the carrier element including the first and the second major surface of the carrier element as well as the edge surfaces between the two major surfaces. The same advantages regarding geometric stability are given. This embodiment also requires an additional dielectric component operating as the dielectric element of the sensing capacitor of a voltage sensing device as described above.

Any other configuration of the first electrode on the carrier element is possible as well, as long as it allows it to function as an electrode of a sensing capacitor. It may for example be possible to provide the first electrode inside of the carrier element, meaning the electrode is covered at least on its two main surfaces by the carrier element.

The first electrode of the voltage sensing device according to the invention may be split into two different, electrically independent areas. For example, the first electrode may provide a partition line that extends in a radial direction around the carrier element such that two electrically separate rings of electrically conductive material may be provided. Depending on the application of the sensing device according to the invention two areas may be of the same size or they may have different sizes. With such a configuration it is possible to use a first ring as a first electrode for the described sensing device and to use a second ring for a different purpose, such as for example as a second sensing electrode for a second voltage sensing device.

The carrier element may comprise a portion having a thickness of for example between 3 and 5 mm. If the carrier element is ring-shaped it may provide an inner diameter d of for example between 15 and 70 mm and an outer diameter D of for example between 21 and 90 mm. The length L of the carrier element may for example be greater or equal than 10 mm.

The voltage sensing device according to the invention may further comprise a dielectric element that is arranged on the radially inner side of the carrier element. The dielectric element may comprise any kind of material as long as it has dielectric properties. The coefficient of thermal expansion of the dielectric in this embodiment is not relevant for the advantages of the invention, since the carrier element, which prohibits an expansion of the dielectric element, ensures the accuracy in measurement already. The dielectric element may for example comprise silicone or EPDM (ethylene propylene diene monomer (M-class) rubber) and may also act as insulation of the conductor of the power cable.

The voltage sensing device according to the invention may comprise an electrically conductive voltage pick-up element arranged such as to be in a mechanical and electrical contact with the electrode.

The invention also provides a combination of a voltage sensing device as described above and a cable connection device and/or a power cable.

The invention further provides the use of a voltage sensing device as described above for sensing voltage in a cable accessory device, a cable splice body or a cable termination body.

The invention will now be described in more detail with reference to the following Figures exemplifying particular embodiments of the invention.

Herein below various embodiments of the present invention are described and shown in the drawings wherein like elements are provided with the same reference numbers.

Figure 1:
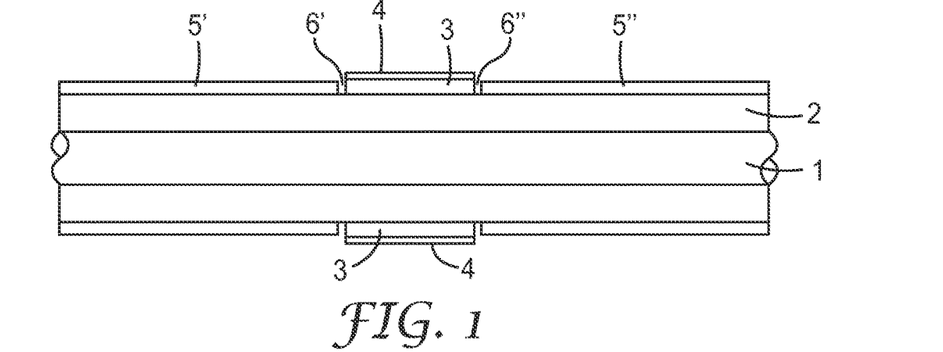
FIG. 1 is a cross sectional view of a first embodiment of a voltage sensing device according to the invention.

FIG. 1 shows a cross sectional view of a first embodiment of a voltage sensing device for a high- and/or medium-voltage power cable according to the invention. In the centre of FIG. 1 a conductor 1 of a high- or medium-voltage power cable can be seen. The voltage sensing device according to the invention may also be arranged around a connector or a bus bar. The conductor 1 is surrounded by an insulation layer 2, which may for example comprise silicone. A carrier element 3 with a tubular shape made out of ceramic (e.g., a ceramic ring) is arranged outside of the insulation layer 2 and surrounds the conductor 1 of the power cable with the insulation layer 2. The ceramic material is silicon nitride ($Si_3N_4$). The coefficient of thermal expansion of this ceramic material is approximately $2.5 \times 10^{-6}$ 1/K 1/K at a temperature of 20° C.

Ceramic products are usually made by using for example a sintering process. The silicone insulation 2 may in this process be molded below the ceramic ring 3. It is also possible to push the ceramic ring 3 onto a pre-molded silicone body 2.

In the embodiment shown in FIG. 1 the ceramic ring provides a metal layer 4 on its first major, radially outer surface. The metal layer 4 may operate as a first electrode of a sensing capacitor of a capacitive voltage sensing device, while the conductor 1 of the power cable may operate as a second electrode of a sensing capacitor of a capacitive voltage. The metal layer 4 comprises a nickel-phosphor plating of the surface of the carrier element 10.

On both sides in an axial direction of the ceramic ring 3 with the metal layer 4, conductive silicone layers 5' and 5" are provided, e.g. molded on top of the insulating silicone layer 2. There is a gap 6', 6" on each side of the ceramic ring 3 between the ring 3 and the conductive silicone layers 5' and 5". The gap may have an extension of about 1 to 5 mm. The conductive silicone layers 5' and 5" may be laying on an earth potential and the metal layer 4 of the ceramic ring 3, that is operating as an electrode of a sensing capacitor of the voltage sensing device, may lay on a free potential.

The sensing capacitor in this embodiment is built out of a first electrode, which is the metal layer 4 on the ceramic ring 3, a dielectric layer, which is built out of the insulation 2 and the ceramic ring, and a second electrode, which is the conductor 1 of the power cable.

Since the ceramic ring 3 is placed on top of the silicone or EPDM insulation 2 and since the ceramic ring 3 is—due to its low coefficient of thermal expansion—temperature stable in its geometry, it prevents a radial expansion of the insulation and therewith assures a constant distance between the two electrodes of the sensing capacitor of the voltage sensing device according to the invention.

Figure 2:
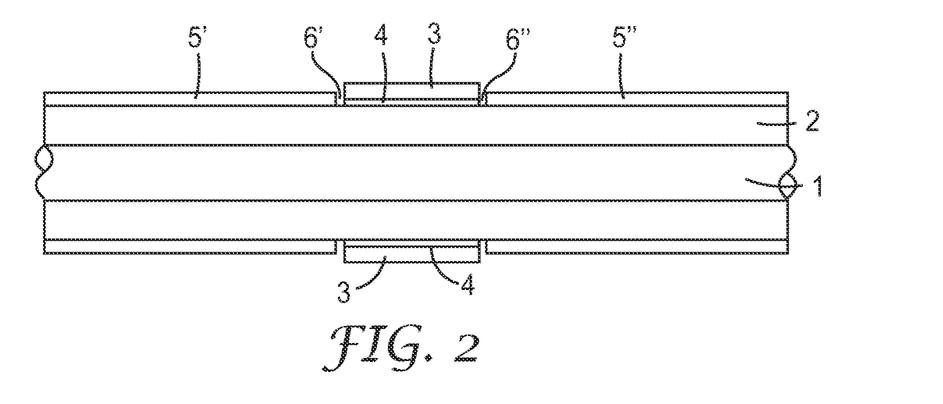
FIG. 2 is a cross sectional view of a second embodiment of a voltage sensing device according to the invention.

The embodiment shown in FIG. 2 differs from that shown in FIG. 1 in that the metal layer 4 is arranged on the radially inner, second major surface of the ceramic ring 3 and not on the radially outer, first major surface of the ceramic ring 3. Thus the sensing capacitor of this embodiment is built out of a first electrode, which is the metal layer 4 inside the ceramic ring 3, a dielectric layer, which is the insulation 2, and a second electrode, which is the conductor 1 of the power cable. In this embodiment, the ceramic ring 3 prevents the thermal expansion of the insulation layer 2, but it does not function as a dielectric element for the sensing capacitor.

Figure 3:
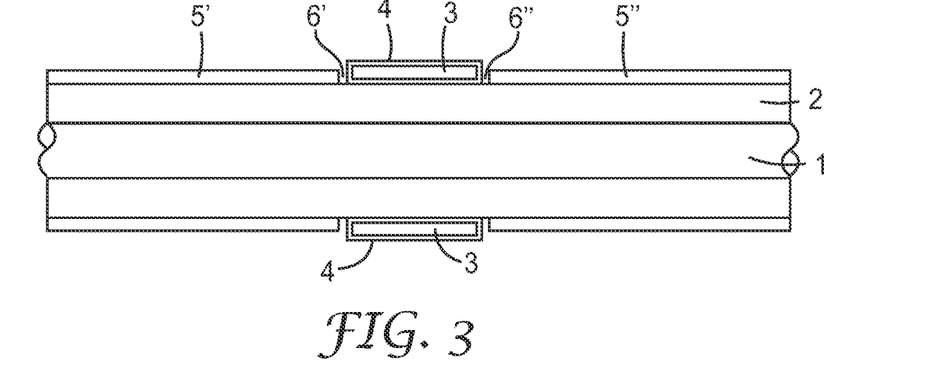
FIG. 3 is a cross sectional view of a third embodiment of a voltage sensing device according to the invention.

The embodiment shown in FIG. 3 differs from that shown in FIG. 1 in that the metal layer 4 is arranged on the entire surface of the ceramic ring 3 and not only on either the radially outer, first major surface of the ceramic ring 3 or the radially inner, second major surface of the ceramic ring 3. Thus the sensing capacitor of this embodiment is built out of a first electrode, which is the metal layer 4 around the ceramic ring 3, a dielectric layer, which is the insulation 2, and a second electrode, which is the conductor 1 of the power cable. In this embodiment, the ceramic ring 3 prevents the thermal expansion of the insulation layer 2, but does not function as a dielectric element for the sensing capacitor.

Figure 4:
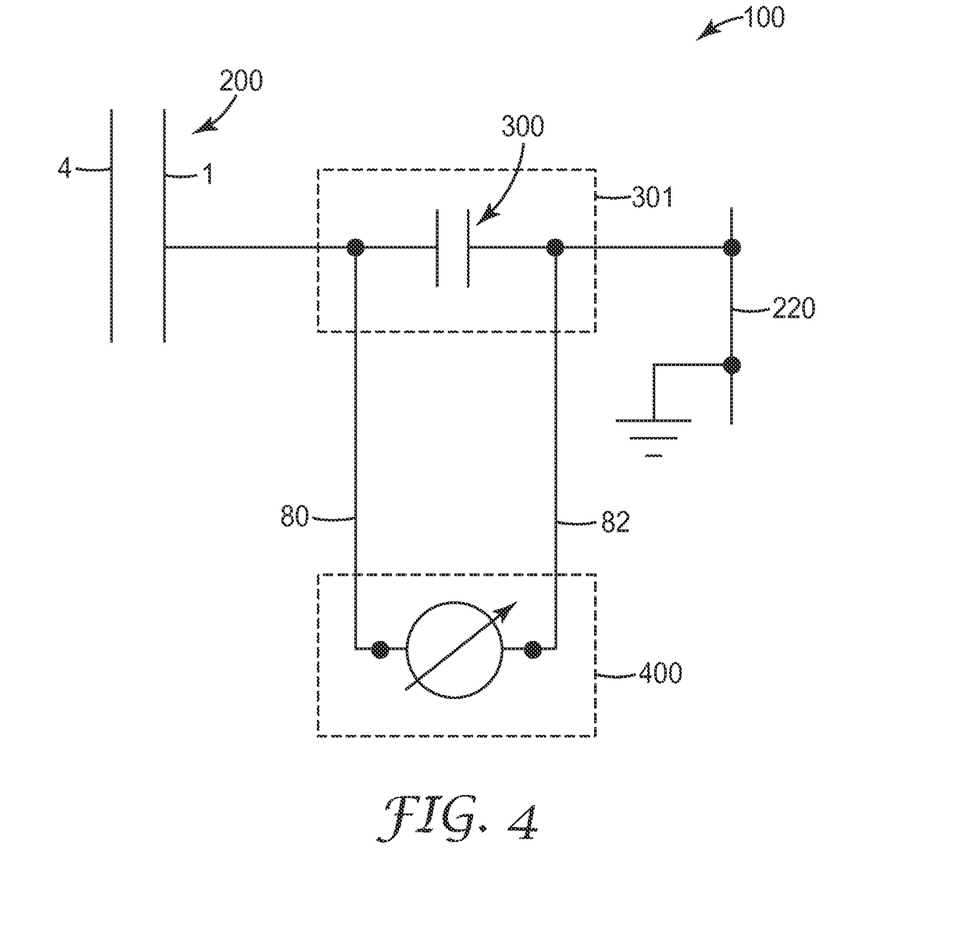
FIG. 4 is an electric circuit diagram of one example of a voltage sensing device according to the invention.

FIG. 4 is an electrical circuit diagram, showing the electrical functionality of the various elements of the capacitive voltage sensor 100, according to the present invention. The sensing capacitor 200 has a first electrode 4 and a second electrode 1. The first electrode corresponds to the metal layer 4 of the ceramic ring 3, the second electrode corresponds to the conductor 1 of a power cable. The sensing capacitor 200 is electrically connected in series with the secondary capacitor 300, which may be arranged on a printed circuit board element 301. The electrical contact between the printed circuit board element 301 and the first electrode may be made via an exposed conductive region of the printed circuit board element 301. Electrically, the secondary capacitor 300 is connected, on one side, to the sensing capacitor 200 and, on the other side, to ground. Voltage of the first electrode 4 of the sensing capacitor 200 versus ground is measured by measuring the voltage across the secondary capacitor 300. The secondary capacitor 300 is therefore electrically connected to a measurement device 400 via a sensor wire 80 and a ground wire 82. The measurement device 400 is electrically connected in parallel to the secondary capacitor 300 via the sensor wire 80 and the ground wire 82. The measurement device 400 measures the voltage between the sensor wire 80 and the ground wire 82. The ground wire 82 is electrically connected to ground via a conductive or semiconductive element 220.

Figure 5:
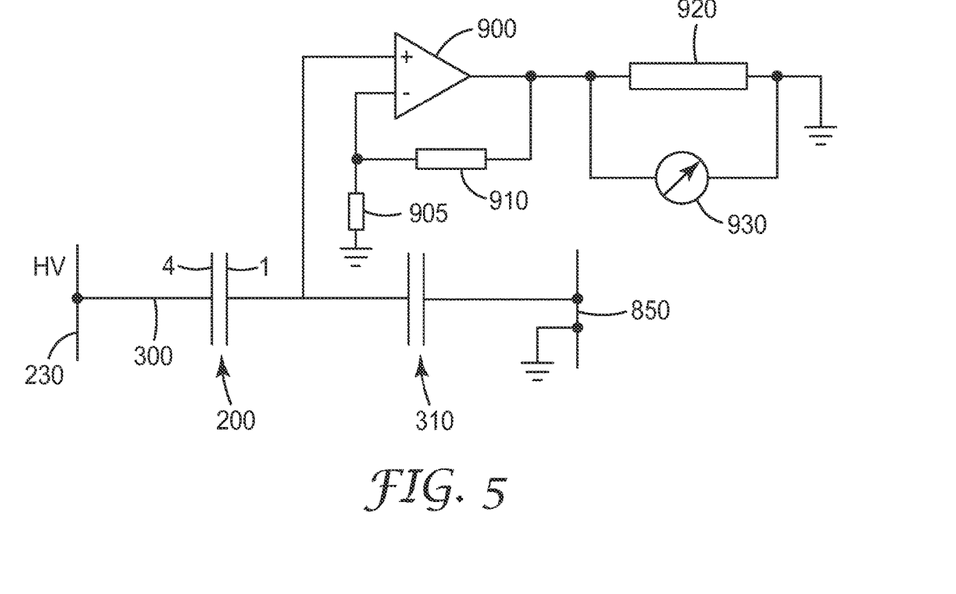
FIG. 5 is an electric circuit diagram of an alternative voltage sensing device according to the invention.

FIG. 5 is a circuit diagram of an electrical circuit that can be used with voltage sensing devices described above instead of the circuit shown in FIG. 4. The inner or first electrode 4, the outer or second electrode 1, the sensing capacitor 200 (or high-voltage capacitor) and the secondary capacitor 300 (or low-voltage capacitor) forming the voltage divider are identical to the corresponding elements in FIG. 4 and will thus not be explained again. In the circuit shown in FIG. 5, an operational amplifier ("OpAmp") 900 is used to sense the voltage of the cable connector 230 and of the inner conductor via the capacitive voltage divider formed by sensing capacitor 300 and the secondary capacitor 810. Specifically, the OpAmp is a so-called transimpedance amplifier. For that purpose of precise voltage sensing, the positive input of the OpAmp 300 is electrically connected to the second electrode 1 of the sensing capacitor 200. The negative input of the OpAmp 300 is electrically connected to ground via a ground resistor 905. Power supply and control elements of the OpAmp 900 are not shown. A feedback resistor 910 is electrically arranged between the output of the OpAmp 900 and its negative input. It provides for stable amplification of the voltage difference between the inputs of the OpAmp 900. The output of the OpAmp 900 is a voltage, which is proportional to the voltage on the second electrode 1 of the sensing capacitor 200 and thereby proportional to the voltage of the cable connector 230 and of the inner conductor over electrical ground. The output voltage of the OpAmp 900 is measured via a measurement resistor 920 and voltage measurement device 930.

Resistance values for the measurement resistor 920, for the ground resistor 905 and for the feedback resistor 910 are in the order of 1 Megohm (MO) each.

For a given voltage of the cable connector 230, the accuracy of the output voltage of the OpAmp 900 in the circuit shown in FIG. 5 depends on the respective electrical tolerances of the sensing capacitor 800, the secondary capacitor 810, the feedback resistor 910 and of the grounding resistor 905. Tolerances for commercially available capacitors are typically not better than 1%, while for commercially available resistors they are typically as low as 0.1% or 0.05%.

In order to achieve an even higher accuracy in determination of the voltage of the cable connector 230 over ground, the circuit shown in FIG. 5 can be modified such that the secondary capacitor 810 of the circuit is no longer necessary. The accuracy of the voltage sensing may thereby increase, because capacitors are only available with comparatively large tolerances of typically 1%. This large tolerance limits the accuracy with which the voltage of the cable connector 230 can be sensed.

Figure 6:
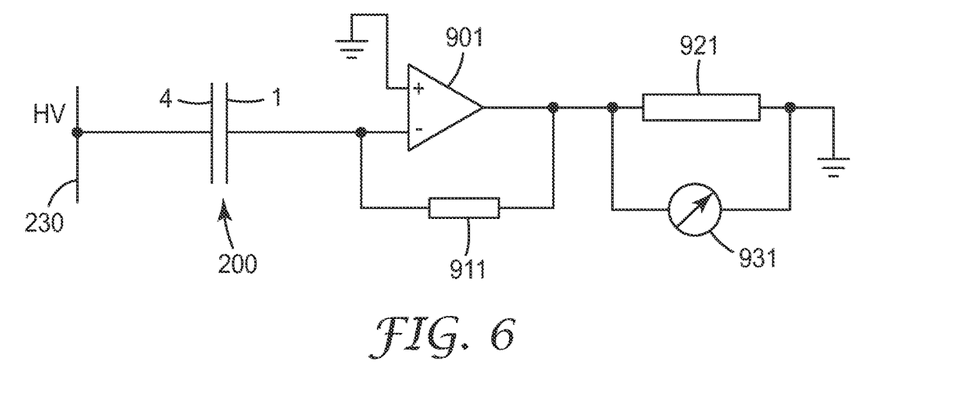
FIG. 6 is an electric circuit diagram of a further alternative voltage sensing device according to the invention.

FIG. 6 is a circuit diagram of such a circuit without the secondary capacitor 810. The first sensing electrode 4 of the sensing capacitor 200 is electrically connected to the high voltage of connector 230. The second sensing electrode 1 is electrically connected to the negative input of an OpAmp 901. The positive input of the OpAmp 901 is on electrical ground. A feedback resistor 911 is electrically arranged between the output of the OpAmp 901 and its negative input. It provides for stable amplification of the voltage difference between the inputs of the OpAmp 901. The output voltage of the OpAmp 901 is measured via a measurement resistor 921 and voltage measurement device 931.

For a given voltage of the cable connector 230, the accuracy of the output voltage of the OpAmp 901 in the circuit shown in FIG. 6 depends on the respective electrical tolerances of the sensing capacitor 800, and of the feedback resistor 910. Compared to the circuit shown in FIG. 5, there are two elements less, the tolerance of which may reduce the accuracy, namely the secondary capacitor and the grounding resistor. Hence in certain scenarios the circuit shown in FIG. 6 may allow for a higher accuracy in sensing the voltage on the connector 230 and on the inner conductor 245 than the circuit shown in FIG. 5.

It is noted that in the circuits shown in FIGS. 5 and 6, integration and inverting of the output signal of the OpAmps 900, 901 may be necessary. This can be achieved by components like a microcontroller, which are not shown in the Figures without a loss of accuracy.

The invention claimed is:

1. Voltage sensing system, comprising:
 a high and/or medium-voltage power-carrying conductor of a power cable further including an insulation layer disposed on the power carrying conductor and a conductive silicone layer disposed on at least a portion of the insulation layer;
 a voltage sensing device comprising;
 a carrier element having a completely closed ring structure with a passageway for receiving the power-carrying conductor, wherein the carrier element is disposed in a gap region of the conductive silicone layer, wherein the carrier element comprises an electrode extending in an axial direction of the passageway of the carrier element and operable as a first electrode of the voltage sensing device, wherein the high and/or medium-voltage power-carrying conductor is operable as the second electrode of the voltage sensing device and wherein
the carrier element has a coefficient of thermal expansion that is less or equal than 5×10^-6 1/K 1/K at 20° C., wherein the voltage sensing device further comprises a dielectric element that is arranged on the radially inner side of the carrier element such that it is positioned between the first and second electrodes, wherein the dielectric element is in direct contact with the inner side of the carrier element and that the combination of the carrier element and dielectric forms the dielectric of a sensing capacitor.

2. Voltage sensing device according to claim 1, wherein the carrier element is shaped such that it surrounds the power-carrying conductor at least partially.

3. Voltage sensing device according to claim 1, wherein the carrier element is tubular and provides a first and an opposed second major surface as well as an axial passageway for receiving the power-carrying conductor.

4. Voltage sensing device according to claim 1, wherein the carrier element comprises a dielectric material.

5. Voltage sensing device according to claim 1, wherein the carrier element comprises a ceramic material.

6. Voltage sensing device according to claim 1, wherein the carrier element comprises one or more material(s) selected from porcelain, mica, silicon nitride, and "IEC/EN 60384 class 1" dielectrics such as $MgNb_2O_6$, $ZnNb_2O_6$, $MgTa_2O_6$, $ZnTa_2O_6$, $(Zn, Mg)TiO_3$, $(ZrSn)TiO_4$, $CaZrO_3$, $Ba_2Ti_9O_{20}$.

7. Voltage sensing device according to claim 1, wherein the carrier element comprises a material selected from polymers having a temperature coefficient of capacitance below $20\times10^{-6}$ 1/K in the temperature range between +10° C. and +130° C., such as Polypropylene, Polyethylene Terepthalathe, Polyester, Polyimide, Polytetrafluoroethylene, Ethylene Chlorotrifluoroethylene, Polyoxymethylene, Polyphenyl Ethers, Polyethylenimine, Polymethylpentene, Cyclic Olefin Copolymer, Polysulfone, Polyetheretherketone, Polyphenylene Sulphide, or Polyethylene Naphthalate.

8. Voltage sensing device according to claim 1, wherein the carrier element comprises a ceramic filler/polymer matrix composite.

9. Voltage sensing device according to claim 1, wherein the carrier element comprises a composition that includes a first ceramic material having a positive temperature coefficient of capacitance and a second ceramic material having a negative temperature coefficient of capacitance.

10. Voltage sensing device according to claim 1, wherein the electrode of the voltage sensing device is arranged on a radially-outer first major surface of the carrier element.

11. Voltage sensing device according to claim 1, wherein the electrode of the voltage sensing device covers an entire surface of the carrier element.

12. Voltage sensing device according to claim 1, wherein the dielectric element comprises at least a portion of the insulating layer of the power-carrying element.

13. Voltage sensing device according to claim 1, comprising an electrically conductive voltage pick-up element arranged such as to be in a mechanical and electrical contact with the electrode.

14. Cable accessory for use with a high and/or medium-voltage power cable in a power network, the accessory comprising a voltage sensing device according to claim 1.

15. Use of a voltage sensing device according to claim 1 for sensing voltage in a cable accessory device, a cable splice body, a cable connector or a cable termination body.

\* \* \* \* \*